United States Patent
Masuda

(10) Patent No.: US 9,410,991 B2
(45) Date of Patent: Aug. 9, 2016

(54) ATTACHMENT STRUCTURE OF CURRENT SENSOR AND ELECTRIC CONDUCTIVE MEMBER

(71) Applicant: YAZAKI CORPORATION, Tokyo (JP)

(72) Inventor: Satoki Masuda, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 18 days.

(21) Appl. No.: 14/662,436

(22) Filed: Mar. 19, 2015

(65) Prior Publication Data

US 2015/0268278 A1 Sep. 24, 2015

(30) Foreign Application Priority Data

Mar. 20, 2014 (JP) .................. 2014-058283

(51) Int. Cl.
*G01R 15/18* (2006.01)
*G01R 15/20* (2006.01)

(52) U.S. Cl.
CPC ............ *G01R 15/207* (2013.01); *G01R 15/202* (2013.01)

(58) Field of Classification Search
CPC ........ G01R 15/207; H01F 38/28; H01F 38/30
See application file for complete search history.

(56) References Cited

U.S. PATENT DOCUMENTS

| 5,831,425 | A  | * | 11/1998 | Ochiai    | ................... | G01R 1/203 324/117 R |
| 6,472,878 | B1 | * | 10/2002 | Bruchmann | ......... | G01R 15/202 324/117 H |
| 8,709,627 | B2 | * | 4/2014  | Matsushima | ...... | G01R 31/3696 324/156 |
| 2008/0094060 | A1 | * | 4/2008 | Muraki | .................. | B82Y 25/00 324/252 |
| 2008/0105476 | A1 | * | 5/2008 | Korich | .................. | H02M 7/003 310/71 |
| 2012/0164867 | A1 |   | 6/2012 | Matsumoto et al. | | |
| 2013/0214593 | A1 | * | 8/2013 | Ohashi | ................. | G01R 15/207 307/10.1 |
| 2013/0320968 | A1 | * | 12/2013 | Sakamoto | .......... | G01R 33/0094 324/244 |
| 2014/0184212 | A1 | * | 7/2014 | Yamaguchi | .......... | G01R 15/207 324/244 |

FOREIGN PATENT DOCUMENTS

JP 2011060438 A 3/2011

* cited by examiner

*Primary Examiner* — Daniel Miller
(74) *Attorney, Agent, or Firm* — Sughrue Mion, PLLC

(57) ABSTRACT

In an attachment structure, a current sensor and an electric conductive member are attached to a housing in a state in which an electric connection portion of the electric conductive member is passed through a measurement hole of the current sensor. The current sensor includes a guide protrusion protruding from a sensor body. The housing includes: a guide wall portion including a guide wall which includes a first side surface opposing the electric conductive member, and which extends along a first direction in which the sensor body moves when attached to the housing, to guide the guide protrusion; and a rotation restricting wall portion which is disposed on the first side surface, and which restricts the electric conductive member from being rotated by a load that is imposed when the electric conductive member is connected to a connection counterpart.

3 Claims, 9 Drawing Sheets

ATTACHMENT STRUCTURE OF CURRENT SENSOR AND ELECTRIC CONDUCTIVE MEMBER

CROSS REFERENCE TO RELATED APPLICATION(S)

This application is based on and claims priority from Japanese Patent Application (Application No. 2014-058283) filed on Mar. 20, 2014, the entire contents of which are incorporated herein by reference.

BACKGROUND

1. Field of the Invention

The present invention relates to an attachment structure of a current sensor and an electric conductive member, for attaching the electric conductive member and the current sensor to a housing.

2. Description of the Related Art

Conventionally, some of connectors or junction boxes having a function of distributing electric power or the like include a current sensor which detects a current flowing through an electric conductive member such as a terminal, and which outputs a detection result to a controller or the like, such as a so-called Hall current sensor. In such a current sensor, a part of an electric conductive member is passed through a measurement hole, and a current flowing through the electric conductive member is measured in a non-contact manner. A connector or junction box which includes such a current sensor incorporates an attachment structure of the current sensor and the electric conductive member for attaching the electric conductive member and the current sensor to a housing in a state in which the electric conductive member is passed through the measurement hole of the current sensor.

For example, JP-A-2011-60438 describes an attachment structure of a current sensor and an electric conductive member in which a female terminal (electric conductive member) having an electric connection portion that can be fastened by a bolt to a connection counterpart to be electrically connected, and a current sensor in which the electric connection portion is passed through a square hole (measurement hole) of the sensor body to measure a current of the female terminal are attached to a housing.

SUMMARY

In the case where the female terminal is to be fastened to the connection counterpart by the bolt, there is a possibility in that the female terminal is rotated in the direction of tightening the bolt, and the electric connection portion of the female terminal is in contact with the inner wall surface of the square hole of the current sensor to damage the current sensor. There is a problem in that, when the current sensor is to be attached to the housing, the current sensor is hardly positioned with respect to the housing, and therefore hardly attached to the housing.

In order to solve the problems, it may be contemplated that a wall for blocking the rotation of the female terminal is disposed in the housing, and a further wall for positioning the current sensor is disposed. However, there arises a problem in that the size of the housing becomes large.

The present invention has been made in view of the above circumstances, and an object thereof is to provide an attachment structure of a current sensor and an electric conductive member in which, while suppressing the increase of the size of a housing, the current sensor is easily attached to the housing, and the current sensor can be prevented from being damaged.

In a first aspect, there is provided an attachment structure of a current sensor and an electric conductive member for attaching the current sensor and the electric conductive member to a housing, the attachment structure including: the electric conductive member including an electric connection portion electrically connectable with a connection counterpart; the current sensor which includes a sensor body having a measurement hole, and which measures a current of the electric conductive member; and the housing to which the electric conductive member and the current sensor are attached in a state in which the electric connection portion is passed through the measurement hole, wherein the current sensor includes: at least one guide protrusion which protrudes from the sensor body, and wherein the housing includes: a guide wall portion including a guide wall which includes a first side surface opposing the electric conductive member, and which extends along a first direction in which the sensor body moves when attached to the housing, so as to guide the guide protrusion when the sensor body is attached; and a rotation restricting wall portion which is disposed on the first side surface of the guide wall, and which restricts the electric conductive member from being rotated by a load that is imposed when the electric conductive member is connected to the connection counterpart.

In a second aspect, there is provided the attachment structure of a current sensor and an electric conductive member according to the first aspect, wherein a plurality of the guide disposed to be spaced from each other with an interval in a second direction perpendicular to the first direction, wherein a plurality of the guide wall portions are disposed so as to correspond to the plurality of guide protrusions, wherein each of the guide walls of the guide wall portions includes a second side surface opposing the corresponding guide protrusion, and wherein an interval between the second surfaces of two adjacent guide walls opposing each other is larger than the interval between two guide protrusions which are guided by the two adjacent guide walls, respectively.

In a third aspect, there is provided the attachment structure of a current sensor and an electric conductive member according to the first or second aspect, wherein the sensor body includes a plurality of the measurement holes arranged in a second direction perpendicular to the first direction, wherein a plurality of the guide protrusions are disposed between the plurality of measurement holes, and wherein a plurality of the guide wall portions are disposed so as to correspond to the guide protrusions.

The attachment structure of a current sensor and an electric conductive member according to the first aspect includes the rotation restricting wall portion which, by using the guide wall for guiding the sensor body, restricts the rotation of the electric conductive member when the electric conductive member is to be connected to the connection counterpart. While suppressing the increase of the size of the housing, therefore, the current sensor is easily attached to the housing, and the current sensor can be prevented from being damaged.

In the attachment structure of a current sensor and an electric conductive member according to the second aspect, the two guide protrusions which are disposed in the current sensor, and which are adjacent to each other can be tightly fitted to the two guide walls that are located between the two guide protrusions, respectively. Therefore, the current sensor can be prevented from being rattled.

In the attachment structure of a current sensor and an electric conductive member according to the third aspect, the sensor body can be stably guided without causing rattling, by the plurality of guide protrusions and the plurality of guide wall portions, and the plurality of guide protrusions and the plurality of guide wall portions are placed with a high space efficiency by using the placement space interval of the electric conductive member in the arrangement direction of the electric conductive member. Therefore, it is possible to effectively suppress the increase of the size of the housing.

DETAILED DESCRIPTION

Hereinafter, a preferred embodiment of the attachment structure of a current sensor and an electric conductive member will be described in detail with reference to the drawings.

Figure 1:
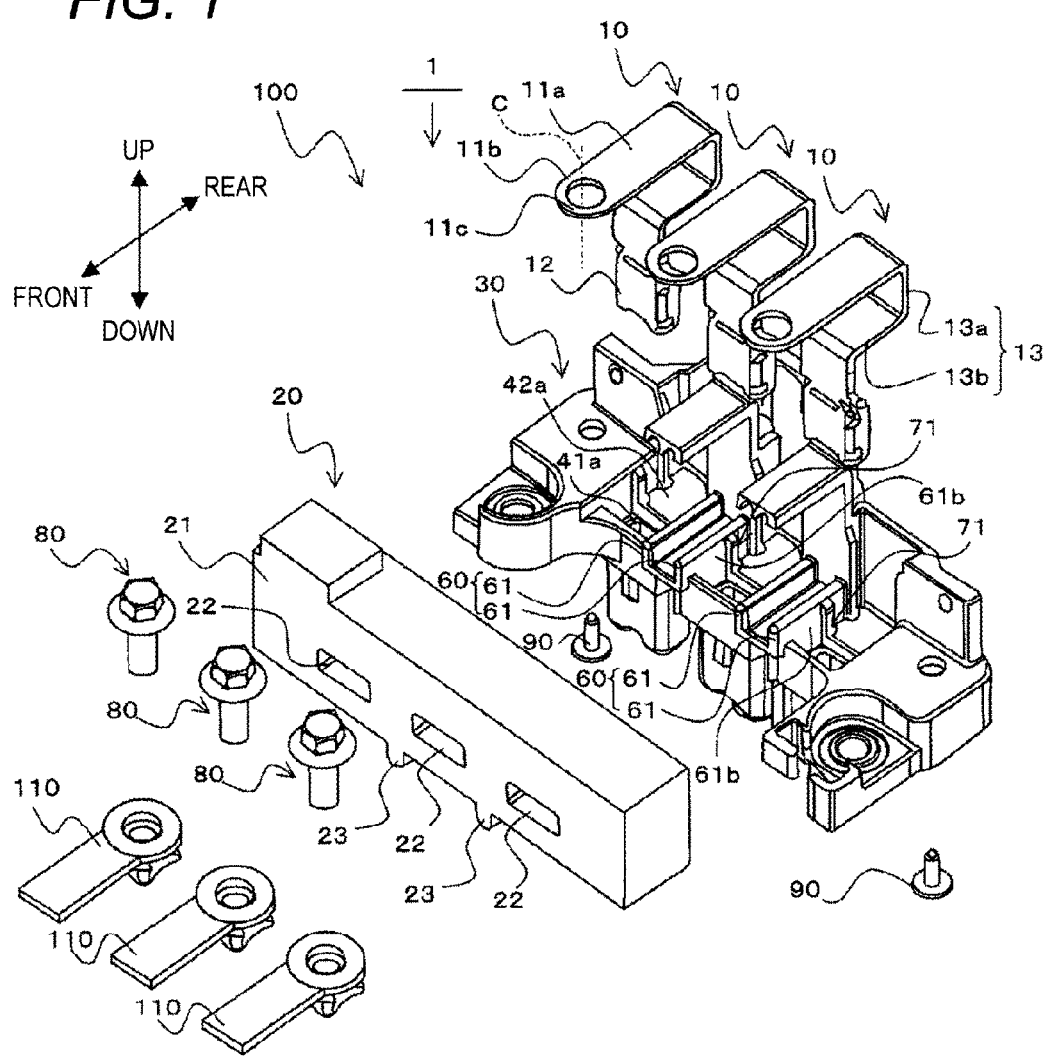
FIG. 1 is an exploded perspective view of a connector into which an attachment structure of a current sensor and an electric conductive member of an embodiment of the invention is incorporated.
Figure 2:
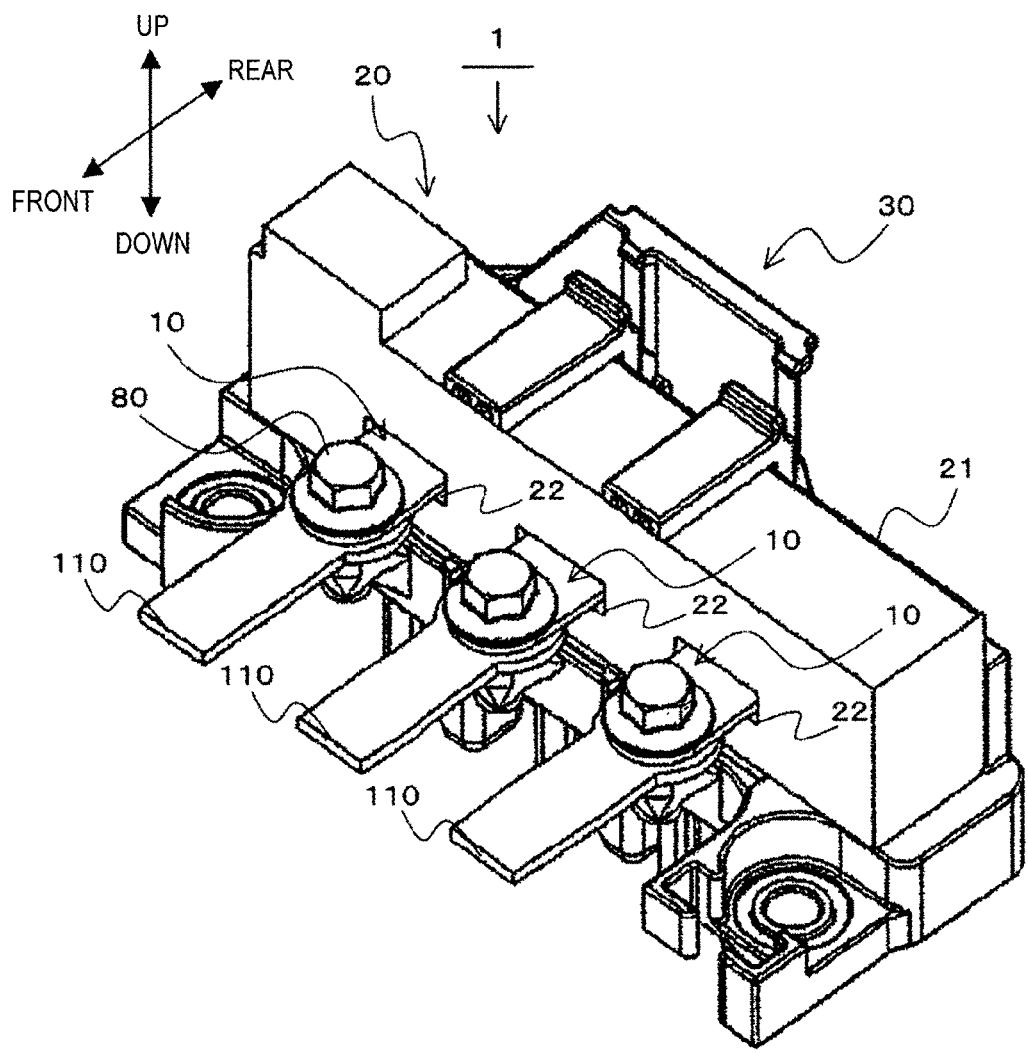
FIG. 2 is a perspective view of the connector shown in FIG. 1.
Figure 3:
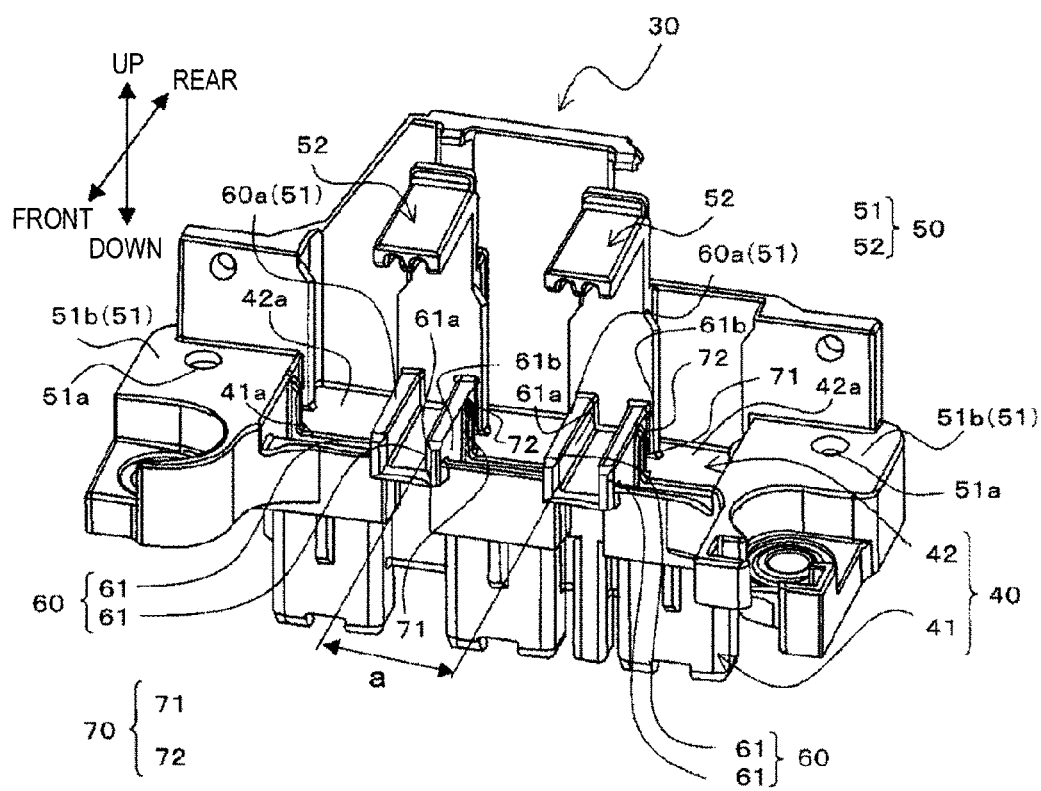
FIG. 3 is a perspective view of a housing shown in FIG. 1.
Figure 4:
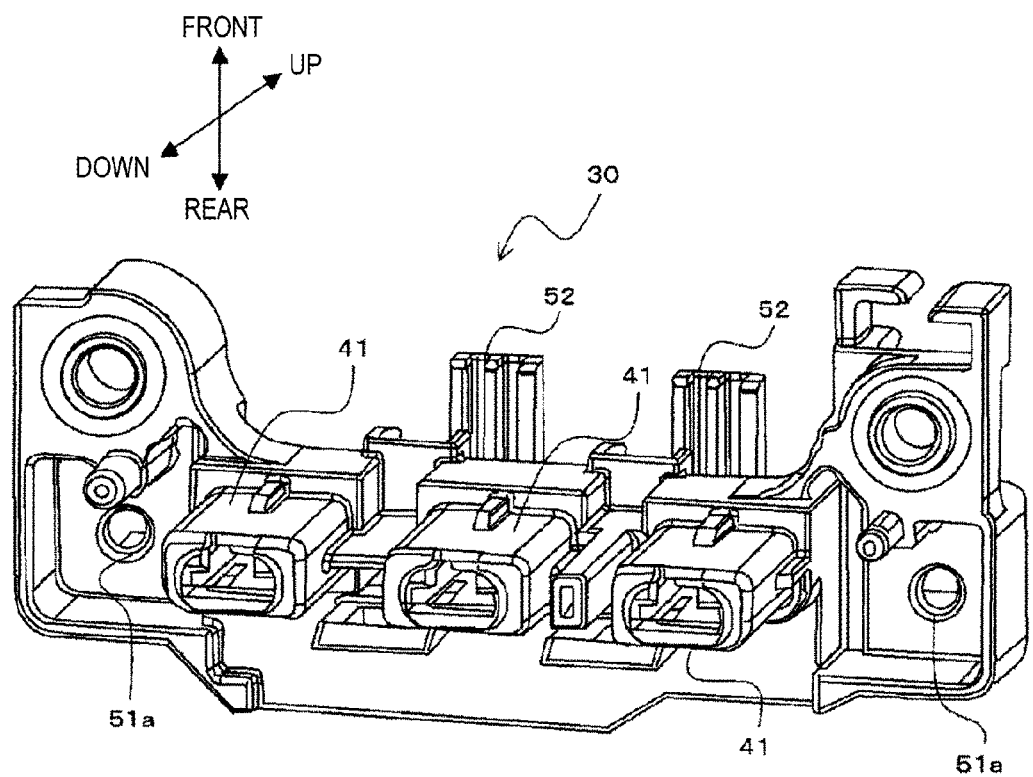
FIG. 4 is a view of the housing as viewed from the obliquely lower side.
Figure 5:
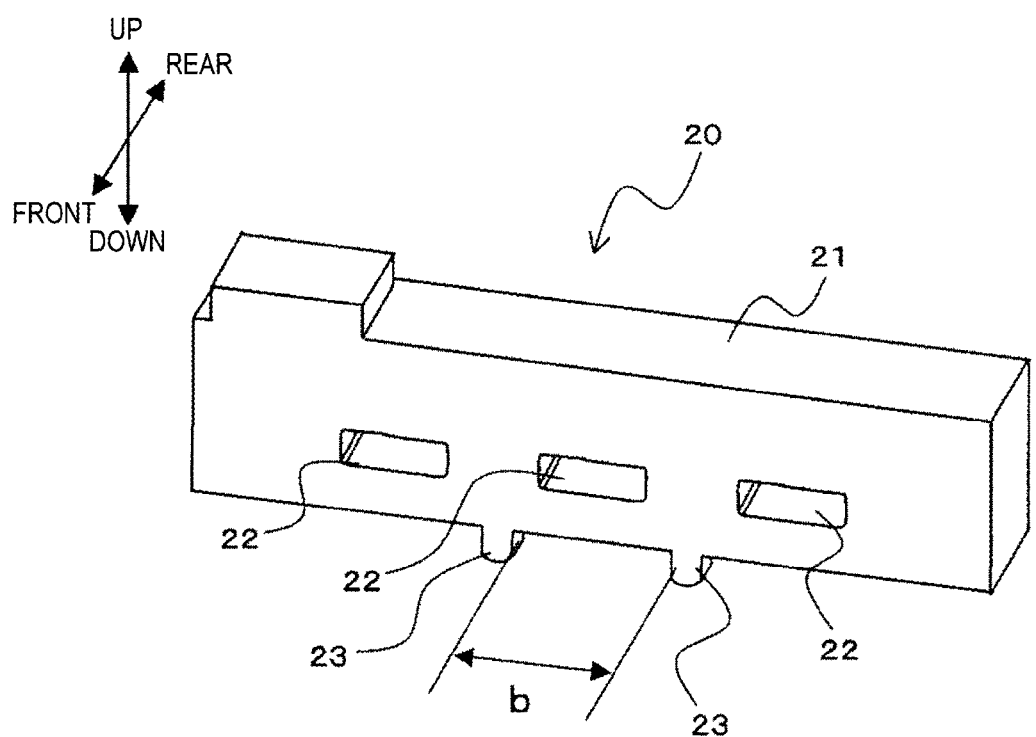
FIG. 5 is an enlarged view of a vicinity of a rotation restricting wall portion of the hosing.
Figure 6:
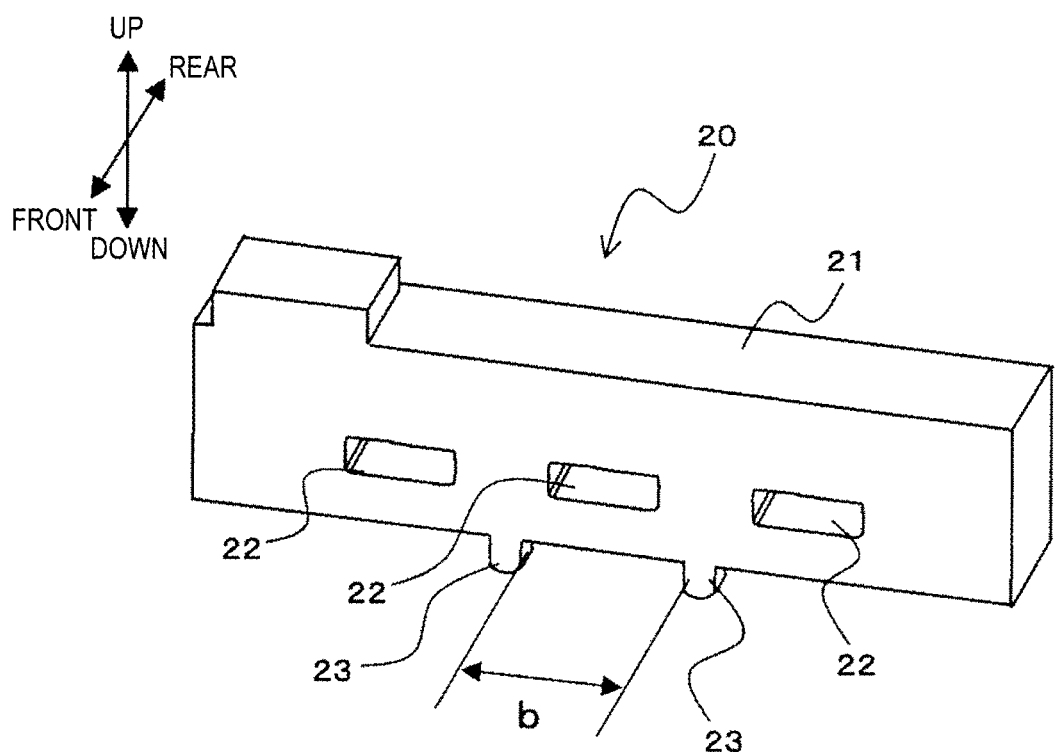
FIG. 6 is a perspective view of the current sensor.
Figure 7:
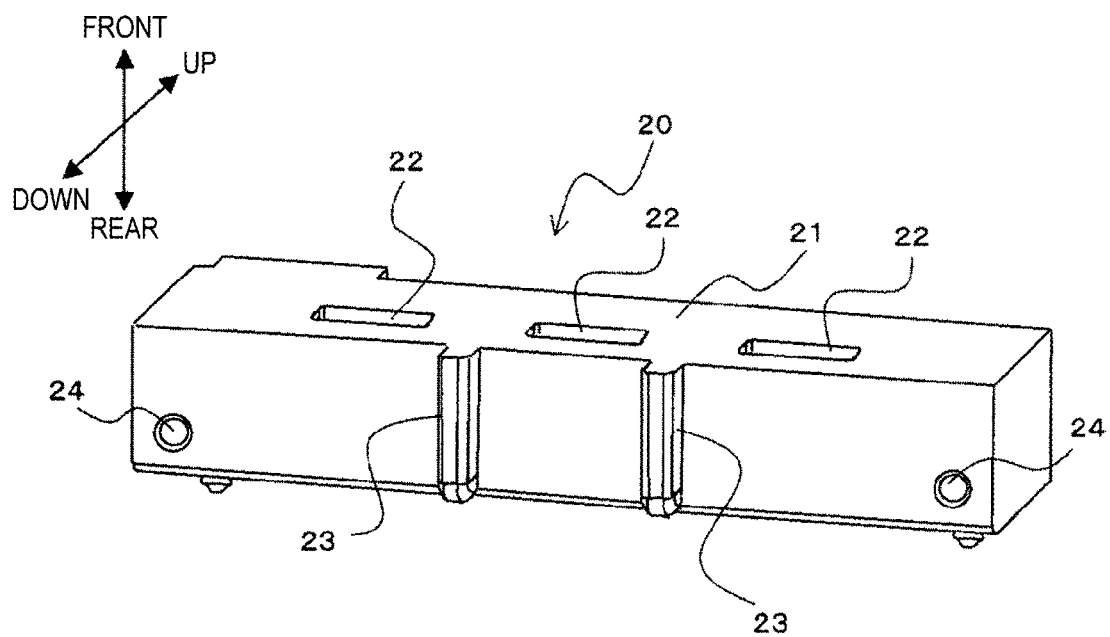
FIG. 7 is a view of the current sensor as viewed from the obliquely lower side.

FIG. 1 is an exploded perspective view of a connector 100 into which an attachment structure 1 of a current sensor and an electric conductive member of an embodiment of the invention is incorporated. FIG. 2 is a perspective view of the connector 100 shown in FIG. 1. FIG. 3 is a perspective view of a housing 30 shown in FIG. 1. FIG. 4 is a view of the housing 30 as viewed from the obliquely lower side. FIG. 5 is an enlarged view of a vicinity of a rotation restricting wall portion 71 of the hosing 30. FIG. 6 is a perspective view of the current sensor 20. FIG. 7 is a view of the current sensor 20 as viewed from the obliquely lower side.

In the embodiment of the invention, for the sake of convenience in description, the forward, rearward, upward, and downward directions are defined as shown in the drawings.

The attachment structure 1 of a current sensor and an electric conductive member of the embodiment of the invention is incorporated into the connector 100 which is to be attached to an apparatus of, for example, an automobile.

The connector 100 is configured so that the connector is connected to bus bars 110 disposed in an apparatus which functions as a to-be-attached member, and which is not shown, and also that the connector is connected by counter connector fitting portions 41 disposed in the housing 30 to a counter connector (not shown) having wires such as a wire harness which is laid in the automobile.

The connector 100 includes: three terminals 10 which serve as electric conductive members, and each of which includes an electric connection portion 11 electrically connectable with the bus bar 110 serving as a connection counterpart; a current sensor 20 in which the electric connection portions 11 are passed through measurement holes 22 of a sensor body 21, and which measures currents of the terminals 10; and the housing 30 to which the three terminals 10 and the current sensor 20 are attached.

The attachment structure 1 of a current sensor and an electric conductive member is a structure for attaching the terminals 10 and the current sensor 20 to the housing 30.

While describing the connector 100, hereinafter, components of the attachment structure 1 of a current sensor and an electric conductive member will be described.

Each of the terminals 10 is formed by applying a punching process and a bending process to a plate-like electric conductive member. In the terminal 10, the electric connection portion 11 which is fastened to the bust bar 110 by a bolt 80 is disposed in one end portion, and a female terminal portion 12 which is connected to a male terminal disposed in the counter connector (not shown) is disposed in the other end portion.

In the terminal 10, the electric connection portion 11 and the female terminal portion 12 are continuous to each other through an intermediate portion 13.

The electric connection portion 11 has a passed portion 11a which is passed through the measurement hole 22 of the current sensor 20 for measuring the current, and a bolt fastened portion 11b which is a tip end portion exposed from the measurement hole 22, and in which a bolt through hole 11c that is used for fastening the bus bar 110 by the bolt 80 is formed.

The female terminal portion 12 is perpendicularly continuous to a parallel-continuous portion 13b which is disposed in the intermediate portion 13, and which will be described later.

The intermediate portion 13 has a perpendicular-continuous portion 13a which is continuously connected perpendicularly to the electric connection portion 11, and the parallel-continuous portion 13b which is continuously connected to the perpendicular-continuous portion 13a so as to be parallel to the electric connection portion 11, and which is continuously connected to the female terminal portion 12.

Namely, the parallel-continuous portion 13b is positioned so as to be parallel and opposingly juxtaposed to the electric connection portions 11. When the electric connection portion 11 rattles, therefore, the parallel-continuous portion is moved in a substantially same manner as the electric connection portion.

The current sensor 20 has the sensor body 21 constituting the body portion, the three measurement holes 22, two guide protrusions 23, and screw holes 24.

The sensor body 21 has a substantially rectangular parallelepiped shape in which the outer portion is made of an insulating material such as synthetic resin.

Each of the measurement holes 22 is a portion through which the passed portion 11a of the electric connection portion 11 is passed to measure a current. The measurement hole 22 is formed into a rectangular shape corresponding to the sectional outer shape of the electric connection portion 11, and configured so as to pass through the sensor body 21 in the short direction.

Such measurement holes 22 are disposed in three places which are juxtaposed in the longitudinal direction of the sensor body 21, respectively.

Each of the guide protrusions 23 is disposed so as to protrude from the sensor body 21. More specifically, the guide protrusion 23 is disposed so as to protrude from the sensor body 21 in the direction of the rotation axis C of the bolt 80 in the case where the bolt 80 is to be fastened.

Such guide protrusions 23 are disposed in two places with forming a space interval in a direction (a second direction) perpendicular to the direction (a first direction) of the movement in which the sensor body 21 is attached to the housing 30. More specifically, the guide protrusions 23 are placed in the longitudinal direction of the sensor body 21 and between the measurement holes 22.

The screw holes 24 are holes into which screws 90 for fixing the sensor body 21 to the housing 30 are attached, and formed in positions corresponding to fixing holes 51a of the housing 30 which will be described later, respectively.

The housing 30 is made of an insulating material such as a synthetic resin, and has: three terminal placement portions 40 where the terminals 10 are placed; a sensor holding and fixing portion 50 for holding and fixing the sensor body 21; guide wall portions 60 which guide the sensor body 21 to the attachment position of the housing 30; and rattling restricting wall portions 70 each of which is configured by a wall for restricting rattling of the corresponding terminal 10.

Each of the terminal placement portions 40 has: a counter-connector fitting portion 41 in which the female terminal portion 12 is placed so as to be connectable to a male terminal of the counter connecter; and an intermediate-portion placing portion 42 in which the intermediate portion 13 is placed.

The counter-connector fitting portion 41 has a hood-like shape in which a terminal insertion port 41a for the female terminal portion 12 is formed on the side of a terminal placement surface 42a that will be described later. In the portion, the female terminal portion 12 is placed so to protrude in the protruding direction of the counter-connector fitting portion 41.

The intermediate-portion placing portion 42 has the terminal placement surface 42a on which the parallel-continuous portion 13b is to be placed.

In the case where the terminal 10 is to be placed on the thus configured terminal placement portion 40, the female terminal portion 12 is pushed from the terminal insertion port 41a into the counter-connector fitting portion 41 until the parallel-continuous portion 13b contacts the terminal placement surface 42a.

The sensor holding and fixing portion 50 has a sensor placement surface 51 on which the sensor body 21 is to be placed, and two sensor holding arms 52.

The sensor placement surface 51 is a surface on which longitudinal end portions of the sensor body 21 are to be placed, and configured by sensor end portion placement surfaces 51b in each of which a fixing hole 51a for screw fixing the sensor body 21 is formed, and upper end edge surfaces 60a of guide walls 60 that will be described later.

The sensor holding arms 52 have an arm-like shape that is bent so as to extend along the rear surface of the sensor body 21 that functions as an inlet side in the direction along which the electric connection portions 11 are to be inserted into the measurement holes 22, and the upper surface of the sensor body 21, and prevents the sensor body 21 from rattling in the vertical direction.

Each of the guide wall portions 60 is configured by a pair of guide walls 61 which are opposed to each other with forming a space interval that is slightly larger than the width of the guide protrusions 23, and disposed along the direction of movement for attaching the sensor body 21, thereby guiding the sensor body 21 to the attachment position while interposing the guide protrusions 23 between the guide walls.

The guide wall portions 60 are disposed in two places correspondingly to the two guide protrusions 23, respectively. As shown in FIGS. 3 and 6, the guide wall portions 60 are adjusted so that the space interval a between surfaces 61a of the two guide walls 61 which are on the sides where the guide protrusions 23 are guided, and which oppose respectively to the guide walls 61 of the respective other guide wall portions 60 is larger than the space interval b between the two guide protrusions 23 that are guided by the two guide walls 61, respectively, before attachment of the current sensor 20 to the housing 30. The surface 61a serves as an example of a second side surface opposing the guide protrusion.

Therefore, the two guide protrusions 23 which are disposed on the sensor body 21, and which are adjacent to each other are tightly fitted to the two guide walls 61 that are located between the two guide protrusions 23, respectively. Therefore, it is possible to prevent the sensor body 21 from rattling, particularly in a direction perpendicular to the direction of the movement in which the sensor body 21 is attached.

The rattling restricting wall portions 70 are walls disposed on electric conductive member placing side surfaces 61b which are surfaces on the sides of the guide wall portions 60 where the terminals 10 are placed, and restrict rattling of the terminals 10. The electric conductive member placing side surface 61b serves as an example of a first surface which opposes the electric conductive member. Each of the rattling restricting wall portions 70 has: a rotation restricting wall portion 71 which protrudes from the corresponding electric conductive member placing side surface 61b so as to be close to a side edge surface of the parallel-continuous portion 13b that is placed on the terminal placement surface 42a, and which extends from the terminal placement surface 42a toward the upper end surfaces of the guide walls 61; and an upper end protrusion 72 which protrudes from an upper end portion of the rotation restricting wall portion 71 so that, in the case where the parallel-continuous portion 13b is viewed from the upper side, the protrusion overlaps with a side part of the parallel-continuous portion 13b.

In the embodiment, the rattling restricting wall portions 70 are disposed, in addition to the guide walls 61, also in walls forming steps between the terminal placement surfaces 42a and the sensor end portion placement surfaces 51b, whereby, also with respect to the two terminals 10 in which the guide wall portions 60 are not located on the lateral side, the rattling restricting wall portions 70 are placed on the both side portions.

The rotation restricting wall portions 71 are walls which restrict the terminals 10 from being rotated by a load that is imposed when the bus bars 110 are to be connected. More specifically, the rotation restricting wall portions 71 are walls which, in the case where the terminals 10 attached to the housing 30 together with the current sensors 20 apt to be rotated in the direction of fastening the bolts 80 by fastening of the bus bars 110 and the bolts 80, the side edge surfaces of the parallel-continuous portions 13b contact so as to block rotation of the bolts 80.

In the embodiment, the rotation restricting wall portions 71 are placed on the sides of the both side portions of the terminals 10. Also in the case where the bolts 80 are to be loosened, therefore, rotation of the bolts 80 is blocked in a similar manner.

In the case where the terminals 10 rattle in the vertical direction, the upper end protrusions 72 contact the upper surfaces of the terminals 10, thereby blocking rattling from occurring.

Although, in the embodiment of the invention, the configuration where each of the rattling restricting wall portions 70 has the rotation restricting wall portion 71 and the upper end protrusion 72 has been exemplarily described, the invention is not limited to this configuration, and the rattling restricting wall portions are requested to have only the rotation restricting wall portion 71.

Next, the procedure of assembling the connector will be described with reference to FIGS. 8, 9A and 9B.

Figure 8:
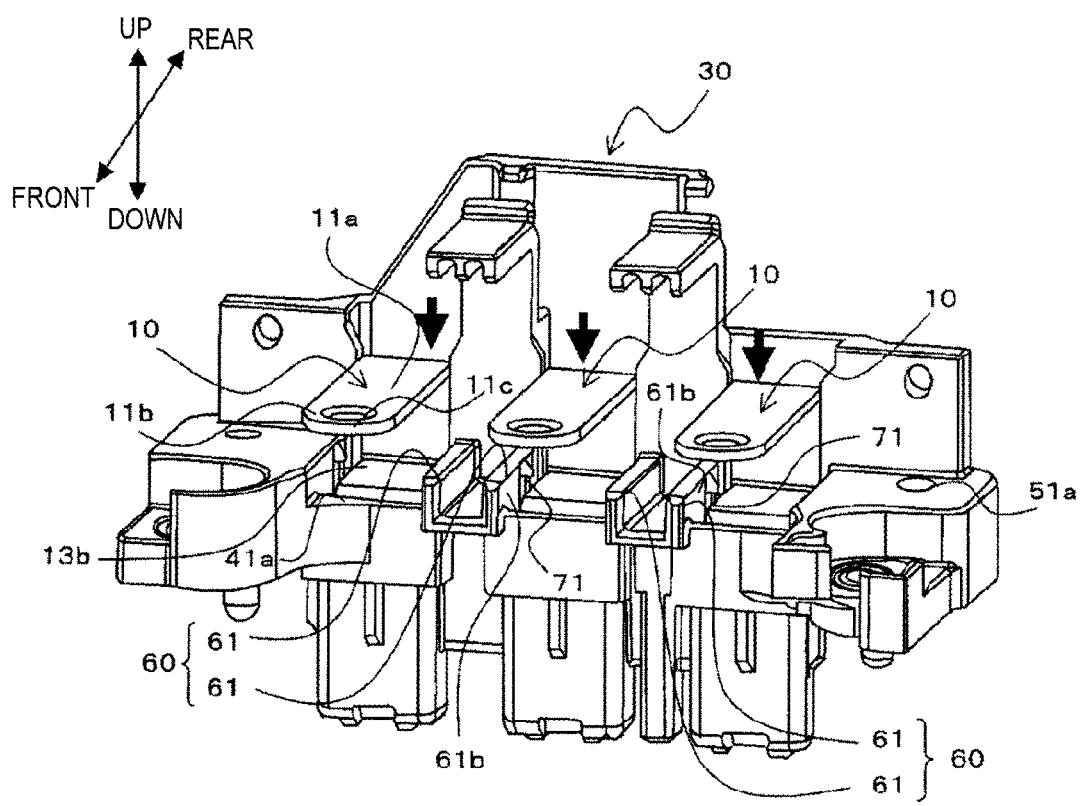
FIG. 8 is a perspective view of an assembly in which terminals are attached to the housing.

FIG. 8 is a perspective view of an assembly in which the terminals 10 are attached to the housing 30. FIG. 9A) is a perspective view of an assembly in which the current sensor 20 is attached to the housing 30 in the assembly of FIG. 8, and FIG. 9B is a perspective view of the connector 100 in which the attachment is completed.

First, the worker attaches the three terminals 10 to the housing 30 (see FIG. 8). Here, the female terminal portions 12 are placed in the counter-connector fitting portions 41, and the parallel-continuous portions 13b are placed on the terminal placement surfaces. This causes the parallel-continuous portions 13b of the terminals 10 to be placed between the opposed rotation restricting wall portions 71.

Figure 9A:
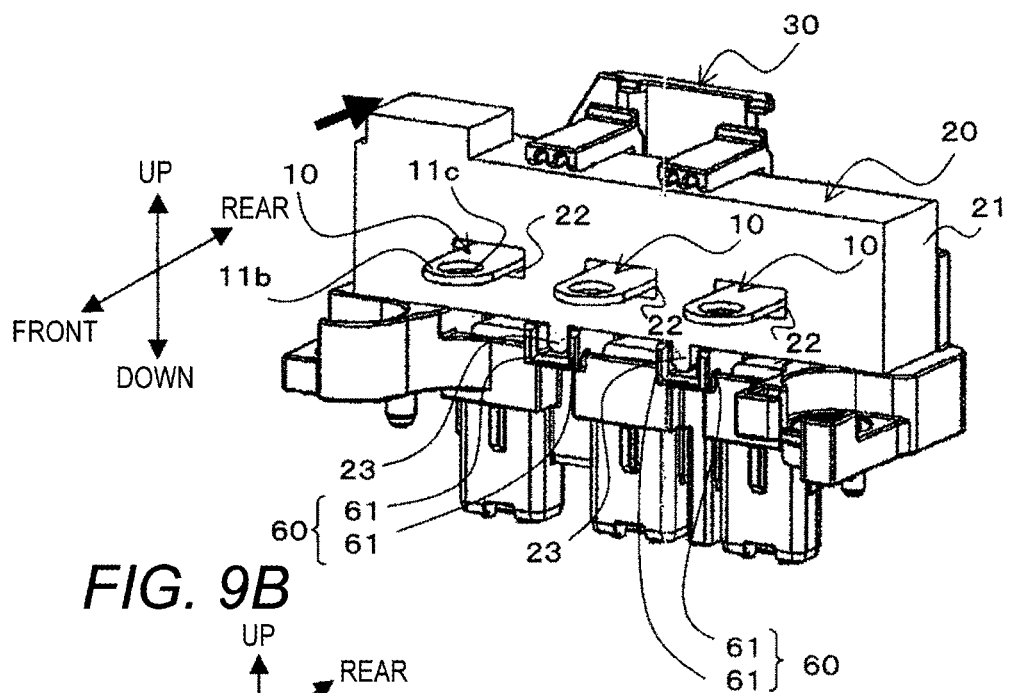
FIG. 9A is a perspective view of an assembly in which the current sensor is further attached to the housing in the assembly of FIG. 8.
Figure 9B:
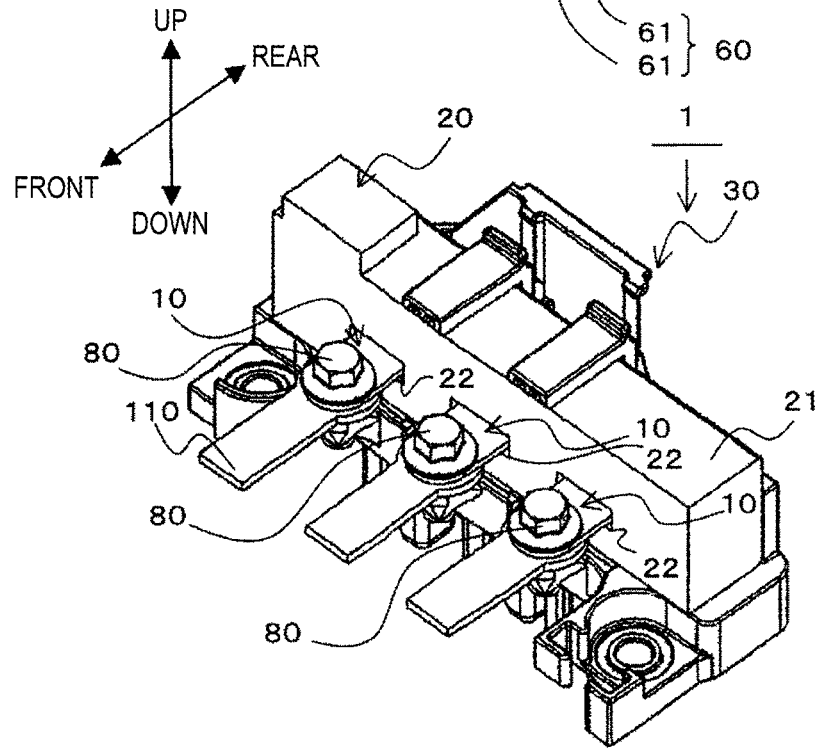
FIG. 9B is a perspective view of the connector in which the attachment is completed.

Thereafter, the worker attaches the current sensor 20 to the housing 30 (see FIG. 9A). Here, the two guide protrusions 23 are fitted between the pairs of guide walls 61 of the corresponding guide wall portions 60 while passing the electric connection portions 11 of the terminals 10 through the measurement holes 22, and the sensor body 21 is moved to the attachment position of the housing 30 while being guided by the guide wall portions 60.

When the sensor body 21 has been moved to the attachment position in this way, the worker fixes the sensor body 21 to the housing 30 by means of the screws 90. At this time, the sensor body 21 is placed in the attachment position while being positioned by the guide protrusions 23 and the guide wall portions 60, and therefore the screw holes 24 of the sensor body 21 and the fixing holes 51a of the housing 30 can be easily aligned with each other.

Thereafter, the worker fastens by bolts the terminals 10 and the bus bars 110 to each other, thereby completing the assembling of the connector 100 (see FIG. 9A). When the terminals 10 apt to be rotated in the direction of tightening the bolts 80, here, the side edge surfaces of the parallel-continuous portions 13b which are rotated in accordance with the movements of the electric connection portions 11 contact the rotation restricting wall portions 71, thereby blocking rotation of the terminals 10. This can prevent the electric connection portions 11 from being contacted with the inner wall surfaces of the measurement holes 22.

In the attachment structure 1 of a current sensor and an electric conductive member of the embodiment of the invention, the rotation restricting wall portions 71 which, by using the guide wall portions 60 for guiding the sensor body 21 to the attachment position, restrict the terminals 10 from being rotated by fastening of the bolts 80 are disposed. While suppressing the increase of the size of the housing 30, therefore, the current sensor 20 can be easily attached to the housing 30, and the current sensor 30 can be prevented from being damaged.

In the attachment structure 1 of a current sensor and an electric conductive member of the embodiment of the invention, moreover, the two guide protrusions 23 which are disposed in the current sensor 20, and which are adjacent to each other are tightly fitted to the two guide walls 61 that are located between the two guide protrusions 23, respectively. Therefore, it is possible to prevent the current sensor 20 from rattling.

In the attachment structure 1 of a current sensor and an electric conductive member of the embodiment of the invention, furthermore, the sensor body 21 can be stably guided without causing rattling, by the two guide protrusions 23 and the two guide wall portions 60, and the two guide protrusions 23 and the two guide wall portions 60 are placed with a high space efficiency by using the placement space interval of the terminals 10 in the arrangement direction of the terminals 10. Therefore, it is possible to effectively suppress the increase of the size of the housing 30.

Although, in the attachment structure 1 of a current sensor and an electric conductive member of the embodiment of the invention, the configuration where the structure is incorporated in the connector 100 has been exemplarily described, the invention is not limited to this configuration, and the structure may be incorporated in another device. For example, the structure may be incorporated in a junction box.

Although, in the attachment structure 1 of a current sensor and an electric conductive member of the embodiment of the invention, the configuration where the electric conductive member is formed by the terminals 10 has been exemplarily described, the invention is not limited to this configuration, and another configuration may be employed as far as the electric conductive member has an electric connection portion electrically connectable with the connection counterpart. For example, the electric conductive member may be a bus bar.

Although, in the attachment structure 1 of a current sensor and an electric conductive member of the embodiment of the invention, the configuration where the electric conductive member is connected to the bus bars 110 functioning as members to be connected, by means of bolt fastening has been exemplarily described, the invention is not limited to this configuration, and another connection structure may be employed as far as the electric conductive member and the connection counterpart can be electrically connected to each other. For example, a connection structure in which an electric conductive member and a connection counterpart are connected to each other by male and female terminals may be employed. Also in a connection structure in which an electric conductive member and a connection counterpart are connected to each other by male and female terminals, the rotation restricting wall portion blocks the rotation of the electric conductive member which is caused by prying or the like in the connection.

Although, in the attachment structure 1 of a current sensor and an electric conductive member of the embodiment of the invention, the configuration where the structure has three terminals the invention is not limited to this configuration has been exemplarily described. In the invention, it is required simply to have at least one terminal.

Although, in the attachment structure 1 of a current sensor and an electric conductive member of the embodiment of the invention, the configuration where each of the guide wall portions 60 is configured by the pair of guide walls 61 which are opposed to each other across the guide protrusions 23, and the one guide protrusions 23 is guided by the pair of guide walls 61 has been exemplarily described, the invention is not limited to this configuration, and one guide protrusions 23 may be guided by one guide wall 60.

Although the invention conducted by the inventor has been described in detail and with reference to the above-described specific embodiment of the invention, the invention is not limited to the embodiment, and various modifications can be made without departing from the scope of the invention.

What is claimed is:

1. An attachment structure of a current sensor and an electric conductive member for attaching the current sensor and the electric conductive member to a housing, said attachment structure comprising:
    the electric conductive member comprising an electric connection portion electrically connectable with a connection counterpart;

the current sensor which comprises a sensor body having a measurement hole, and which measures a current of the electric conductive member; and the housing to which the electric conductive member and the current sensor are attached in a state in which the electric connection portion is passed through the measurement hole, wherein the current sensor comprises:
- at least one guide protrusion which protrudes from the sensor body, and wherein the housing comprises:
- a guide wall portion comprising a guide wall which comprises a first side surface opposing the electric conductive member, and which extends along a first direction in which the sensor body moves when attached to the housing, so as to guide the guide protrusion when the sensor body is attached; and
- a rotation restricting wall portion which is disposed on the first side surface of the guide wall, and which restricts the electric conductive member from being rotated by a load that is imposed when the electric conductive member is connected to the connection counterpart.

2. The attachment structure of a current sensor and an electric conductive member according to claim 1,
- wherein a plurality of the guide protrusions are disposed to be spaced from each other with an interval in a second direction perpendicular to the first direction,
- wherein a plurality of the guide wall portions are disposed so as to correspond to the plurality of guide protrusions,
- wherein each of the guide walls of the guide wall portions comprises a second side surface opposing the corresponding guide protrusion, and
- wherein an interval between the second surfaces of two adjacent guide walls opposing each other is larger than the interval between two guide protrusions which are guided by the two adjacent guide walls, respectively.

3. The attachment structure of a current sensor and an electric conductive member according to claim 1,
- wherein the sensor body comprises a plurality of the measurement holes arranged in a second direction perpendicular to the first direction,
- wherein a plurality of the guide protrusions are disposed between the plurality of measurement holes, and
- wherein a plurality of the guide wall portions are disposed so as to correspond to the guide protrusions.

* * * * *